(12) United States Patent
Martin

(10) Patent No.: US 10,014,195 B2
(45) Date of Patent: Jul. 3, 2018

(54) DECAPSULATION SYSTEM

(71) Applicant: Kirk Alan Martin, Aptos, CA (US)

(72) Inventor: Kirk Alan Martin, Aptos, CA (US)

(73) Assignee: RKD Engineering Corporation, Scotts Valley, CA (US)

( * ) Notice: Subject to any disclaimer, the term of this patent is extended or adjusted under 35 U.S.C. 154(b) by 0 days.

(21) Appl. No.: 15/661,330

(22) Filed: Jul. 27, 2017

(65) Prior Publication Data

US 2017/0323812 A1    Nov. 9, 2017

Related U.S. Application Data

(62) Division of application No. 14/887,832, filed on Oct. 20, 2015, now Pat. No. 9,721,816.

(51) Int. Cl.
| | |
|---|---|
| *H01L 21/302* | (2006.01) |
| *H01L 21/67* | (2006.01) |
| *H01L 21/311* | (2006.01) |
| *H01L 21/50* | (2006.01) |

(52) U.S. Cl.
CPC .. *H01L 21/67126* (2013.01); *H01L 21/31111* (2013.01); *H01L 21/67075* (2013.01); *H01L 21/50* (2013.01)

(58) Field of Classification Search
CPC ........... H01L 21/32134; H01L 21/3213; H01L 21/67075; H01L 21/31111; H01L 21/67126; H01L 21/306; H01L 21/62126; H01L 21/50

USPC ........... 438/106, 112, 745, 754; 156/345.11, 156/345.19, 345.23
See application file for complete search history.

(56) References Cited

U.S. PATENT DOCUMENTS

| | | | | |
|---|---|---|---|---|
| 5,855,727 A | * | 1/1999 | Martin | H01L 21/67126 156/345.18 |
| 7,772,030 B2 | * | 8/2010 | Ji | G01R 31/2898 156/345.35 |
| 8,945,343 B2 | * | 2/2015 | Wagner | C25F 7/00 156/345.18 |
| 9,543,173 B2 | * | 1/2017 | Wagner | H01L 21/67126 |

* cited by examiner

*Primary Examiner* — Lan Vinh
(74) *Attorney, Agent, or Firm* — Donald R. Boys; Central Coast Patent Agency, LLC

(57) ABSTRACT

A decapsulation apparatus has an etch plate, an off-center etch head having an opening, a cover sealing to the etch plate forming an etching chamber, a gasket surrounding the opening, a ram sealed through the cover, a pressure-controlled source of Nitrogen or inert gas continuously purging the etching chamber at a low gas pressure, a f toggle mechanism mounted to a metal plate t, an etchant supply subsystem comprising sources of etchant solutions, an etchant solution pump, supply passages and controls to select etchants and etchant ratios, and a heat exchanger heating or cooling the etchant solution, etchant waste passages f conducting used etchant away. Etchants are mixed in the passages to the reaction region, and turbulence in the reaction region is promoted by impinging etchant solution on the encapsulated device.

9 Claims, 6 Drawing Sheets

DECAPSULATION SYSTEM

CROSS-REFERENCE TO RELATED DOCUMENTS

The present patent application is a divisional application of pending U.S. application Ser. No. 14/887,832, filed on Oct. 20, 2015. Disclosure of prior application is incorporated herein in its entirety by reference.

BACKGROUND OF THE INVENTION

1. Field of the Invention

The present invention is in the field of semiconductor manufacturing and pertains more particularly to methods and apparatus for applying an etchant to decapsulate all or a portion of an encapsulated electronic device.

2. Discussion of the State of the Art

Plastic packaging of various electronic devices, including semiconductor chips, is a well-known process that has been practiced for a long time. Typically, an epoxy or other plastic resin is molded around a semiconductor device creating a chip package. The molding protects a central portion of a lead frame and bonding wires or other connections between contact pads on the chip or device to inner lead fingers on the lead frame. It is often required to decapsulate such a semiconductor package at least in part to allow for device inspection, device testing and, if needed, repair of the chip and or wire bonds to the chip and inner lead fingers after the encapsulation material covering these elements is removed.

Most commonly, concentrated acids such as sulfuric acid and fuming nitric acid and other liquid materials are used in the decapsulation process to etch the resin material. One challenge in decapsulation systems of prior art is controlling the exact amount of etchant injected into the process. Moreover, a related challenge is preventing damage to the package under process, including preventing damage to interior copper or other metal wires or metal components of the device.

It is desired in some cases that devices which are already attached to a printed circuit board (PCB) or other substrate be decapsulated without removing the semiconductor device from the PCB or mounting substrate. Removing the solder may create additional defects. Additional operational artifacts can be confused with defects built into the device or defects resulting from mounting the device to the PCB or substrate.

Prior art decapsulating systems are also limited in the size of device that can be mounted by the size of the etch plate and safety cover. Prior art systems have the etch plate or etch head centrally located. Therefore to accommodate, for example, a six inch square sample, the etch plate and cover must be over 12 inches square, lending to a system that is too large to handle the pressurization on the cover and etch plate. Some systems use an etch plate manufactured of virgin polytetrafluoroethylene (PTFE) and supported only on the periphery of the system. The higher pressure range may damage or deform the etch plate.

Yet a further limitation of prior decapsulating systems is that due to triboelectric characteristics of the PTFE etch plate, high electrostatic discharge from the plate may occur during movement of the device from the plate and fixture. Furthermore, if the device is mounted to a PCB or substrate there is a possibility of electrostatic discharge (ESD) damage to PCB interconnects and the clamping apparatus holding the device cover down.

Therefore, what is clearly needed is a decapsulation system that eliminates the problems described above.

BRIEF SUMMARY OF THE INVENTION

In one embodiment of the invention a decapsulation apparatus is provided comprising an etch plate supporting substantially off-center an etch head having an opening for exposing a portion of an encapsulated device to etchant solution, a vertically translatable cover sealing to the etch plate, the etch plate and cover forming an etching chamber over the etch head, a gasket on the etch head surrounding the opening, the gasket for sealing an encapsulated device or a portion of a printed circuit board (PCB) supporting an encapsulated device to the etch head, exposing the encapsulated device through the opening to etchant solution, a ram mechanism sealed through the vertically-translatable cover, adapted to translate a ram downward to urge the encapsulated device or PCB against the gasket, a pressure-controlled source of Nitrogen or inert gas coupled into the etching chamber, continuously purging the etching chamber at a low gas pressure, a force-producing, locking toggle mechanism mounted to a metal plate to which the etch plate is also mounted and a top of the cover, the toggle mechanism adapted to exert a downward force on the cover, to keep the cover sealed against upward force exerted by the nitrogen supplied to the etch chamber, the mechanism releasable to open the cover, an etchant supply subsystem comprising one or more sources of etchant solutions, an etchant solution pump, supply passages to a reaction region adjacent the encapsulated device, and controls to select etchants and etchant ratios, a controlled heat exchanger through which the supply passages pass, heating or cooling the etchant solution transported to the encapsulated device, one or more etchant waste passages from the reaction region for conducting used etchant away from the encapsulated device, wherein etchants are mixed in the passages to the reaction region, and turbulence in the reaction region is promoted by impinging etchant solution on the encapsulated device.

In one embodiment the controlled heat exchanger utilizes electric heaters and thermoelectric cooling elements to control temperature of the etchant mixture to temperatures between 0 degrees Celsius and 250 degrees Celsius. Also in one embodiment the etch plate is supported by both a metal plate to which the lift mechanism is mounted and a secondary metal support between the heat exchanger and etch plate so as to prevent deformation of the etch plate. Also in one embodiment the toggle mechanism for the safety cover comprises two synchronized lift arms operated by two independent toggle mechanisms. Also in one embodiment the two independent toggle mechanisms are synchronized by a single lever and link with a travel stop for the single lever.

In one embodiment of the invention the single lever has its rotational motion reversed by a two gear mechanism. Also in one embodiment the two lift arms function as springs to maintain force on the safety cover. Also in one embodiment additional Bellville springs are used to augment the spring qualities of the lift arms. Also in one embodiment continuously purging with nitrogen or other gas is accomplished by intermittently introducing high pressure dry nitrogen or other gas directly into the etching chamber. And in one embodiment the pressure is maintained in the etching chamber by introducing high pressure dry nitrogen or other gas when the pressure in the chamber is less than a preprogrammed level and terminating the introduction when the pressure in the chamber reaches a level somewhat greater that the preprogrammed level.

In an alternative aspect of the invention a method for decapsulating is provided comprising the steps placing an encapsulated device or a printed circuit board including an encapsulated device on a gasket on an etch head supported substantially off-center on an etch plate, the etch head and gasket having an opening exposing the encapsulated device to a reaction region below the etch head, sealing a vertically-translatable cover to the etch plate with a toggle mechanism mounted to a metal plate to which the etch plate is mounted, the etch plate and cover forming an etching chamber over the etch head, urging the encapsulated device against the gasket by a ram mechanism operating sealed through the cover, continuously purging the etching chamber with a pressure-controlled source of Nitrogen or inert gas, delivering an etchant solution to the reaction region from a controlled pump drawing etchant solution in a preset ratio from one or more sources, heating or cooling the etchant solution in passages leading to the reaction region through a heat exchanger, and removing used etchant solution from the reaction region through one or more waste passages.

In one embodiment of the method a portion of the etchant is oscillated out of and back into the reaction region, digesting resinous material on the encapsulated device to form a hole in the resinous material. Also in one embodiment the temperature of the etchant mix is controlled to be in a range of from 0 degrees Celsius to 250 degrees Celsius. Also in one embodiment multiple interlocking gaskets are used to seal the PCB or encapsulated device to the etch head.

In one embodiment of the method the controlled pump draws etchant solution from two separate sources, one providing fuming sulphuric and the other fuming nitric acid, shear mixes the solution in the passages through the heat exchanger, and oscillates a portion of the mixture into and back out of and back into the reaction region. Also in one embodiment the ratio of nitric to sulphuric acid in the etchant solution is controlled, and the heat exchanger is controlled to maintain the temperature of the etchant solution above the known freezing temperature of the etchant solution at the ratio selected and controlled. Also in one embodiment the ratio of nitric to sulphuric acid in the etchant solution is controlled, and the heat exchanger is controlled to maintain the temperature of the etchant solution below the known boiling temperature of the etchant solution at the ratio selected and controlled. In one embodiment the ratio of nitric to sulphuric acid is controlled to be 0:1, 1:1, 2:1, 3:2, 3:1, 7:2, 4:1, 5:1, 6:1, 9:1, or 1:0. And in one embodiment multiple interlocking gaskets are used to seal the encapsulated device or PCB to the etch head, wherein each gasket has a rectangular recess that precisely fits the next higher gasket, each gasket is larger than the next higher gasket, and the top gasket has a recess that closely fits the encapsulated device or PCB.

DETAILED DESCRIPTION OF THE INVENTION

In various embodiments described in enabling detail herein the inventor provides a unique system for decapsulating semiconductor devices including devices mounted to printed circuit boards or other substrates and with other components mounted. The present invention is described using the following examples, which may describe more than one relevant embodiment falling within the scope of the invention.

Figure 1:
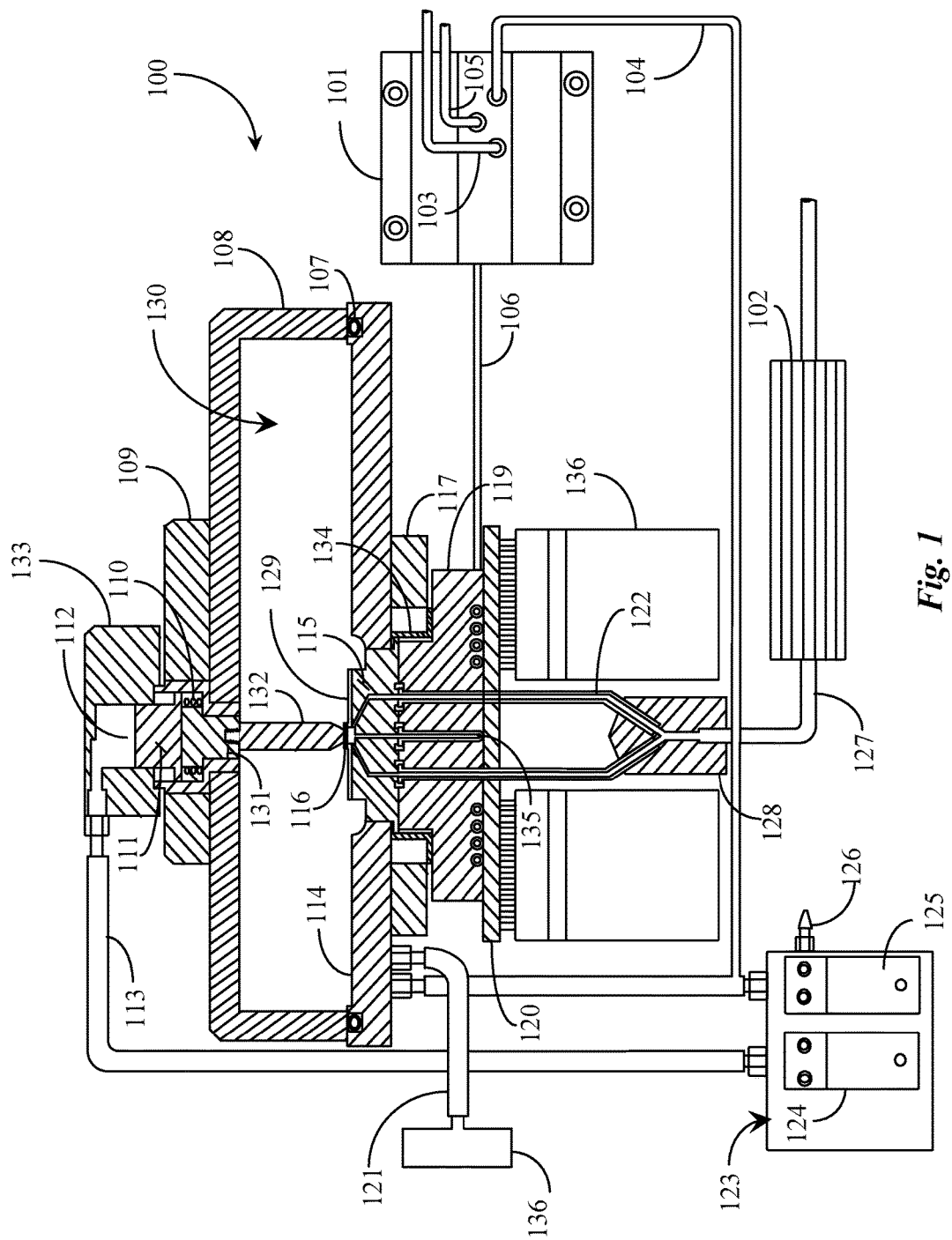
FIG. 1 is a partial section view of a decapsulating system according to an embodiment of the invention.

FIG. 1 is a partial section view of a decapsulating system 100 according to an embodiment of the invention. Decapsulation system 100 includes an etchant delivery pump 101. Pump 101 delivers one or a mix of decapsulation etchant into a decapsulator heat exchanger 119 via a delivery line 106. Pump 101 includes a supply line 103 to an etchant source and a supply line 105 to a different etchant source (etchant source containers not illustrated). Decapsulation system 100 includes an etch head 115 mounted (clamped in one implementation) to an etch plate 114. Etch head 115 supports device mounting apparatus enabling mounting of a semiconductor device that is in turn mounted to a PCB or similar substrate. One such device is depicted herein as a semiconductor device or package 116. Package 116 is an encapsulated package and may require decapsulation at least in part to reveal components for quality or lot control (QC) testing and repair if required. Etch head 115 may be clamped to heat exchanger 119 by a retainer ring 134. Etch head 115 may be sealed to etch plate 114 via an O-ring seal.

System 100 includes an etch chamber cover 108 that fits over etch plate 114 to create an etching chamber that can withstand high pressurization. Cover 108 may be locked or clamped down over etch plate 114 using a unique clamping apparatus that is described in detail later in this specification. Cover 108 is moveable and may be unclamped and lifted off etch plate 114 using the same apparatus described above for clamping the cover onto the etch plate. In this example package 116 rests on a gasket 129. Cover 108 may be sealed to etch plate 114 using an O-ring seal 107.

When cover 108 is clamped in place over etch plate 114, an etch chamber 130 is created. Etch head 115 may be clamped over a heat exchanger 119 in system 100. Etch head 115 has a passage 135 adapted to deliver etchant and dispenses of waste etchant through two waste passageways 122. Passages 135 and 122 extend into the heat exchanger with waste passages 122 extending out of the heat exchanger. System 100 includes a ram nose 132. Ram nose 132 is driven toward device package 116 by a ram piston 111 against a ram 131 to which ram nose 132 is threaded.

Pressure for driving the ram may be supplied by a pressurized source of gas, such as inert nitrogen gas. A valve mechanism 123 hosting two electrically operated valves 124 and 125 may be provided to meter pressurized nitrogen to pressure chamber 112. Valve 124 may be operated to allow nitrogen gas to pass through a tube 113 fitted onto a passageway into the pressure chamber. Nitrogen gas may be used to pressurize chamber 112 to drive ram nose 132 against the device package sealing the device package to gasket 129 and etch head 115. A ram return spring 110 is provided to withdraw ram nose 132 from the device package when pressure in chamber 112 is released.

Ram piston 111 and ram 131 may be housed within a ram mount 133. Cover 108 may be fixed or otherwise attached to a cover mount 109. In one implementation, ram mount 133 includes a mounted optical position sensor (not illustrated) that may detect full extension of ram 132 and ram piston 111. Valve plate 123 includes an electrically operated valve 125 that may allow passage of nitrogen from the same source through a tube 134 into the etch chamber 130 through etch plate 114 during purge operations. When valve 124 is not activated, the volume of chamber 112 and tube 113 may be vented to the environment.

System 100 includes a pressure transducer 136 having connection to etch plate 114 via a fitted tube 121. In operation, pressure within chamber 130 is monitored by transducer 136. Pressure threshold measurements may be observed for both high pressure states and low pressure states. For example, if pressure within chamber 130 drops below a minimum threshold as measured by transducer 136, the electronic controller or control system may open valve 125. When the pressure in chamber 130 exceeds a certain pressure threshold value as measured by the transducer, the controller or control system may close valve 125. In this way the pressure within chamber 130 may be managed to be within an expected range that is lower than the pressure of the source tank or container of nitrogen.

Pump 101, as described above, has an etchant delivery tube 106 leading from pump 101 into heat exchanger 119. Tube 106 has a flanged end (not visible) that may be sealed via an O ring against etch head 115. Tube 106 connects to the source delivery passage 135 in the heat exchanger, which in turn enters the etch head. Pump 101 draws etchant from supply containers through lines 103 and 105 and pumps the etchant into line 106 for delivery to the decapsulator. Tube 104 is a nitrogen purge line. When the etchant delivery is in heat exchanger 119, it may assume a temperature similar to that of the heat exchanger.

Heat exchanger 119 may be heated by one or more electrically-controlled heating devices 136 and may be cooled by a thermoelectric cooling assembly 120. A control system may be used to monitor and to control or adjust the temperature of the heat exchanger. The desired temperature value may be below ambient temperature, as low as zero degrees Celsius (C.) for packages containing copper metalization. The temperature may also be maintained above the boiling points of the etchants, such as at two hundred and fifty degrees C. for packages not containing any copper metallization.

Pump 101 may be controlled to select either one or the other enchant supply tubes 103 or 105 to activate etchant delivery at each delivery cycle. In this way pump 101 may deliver one etchant at a time or any ratio of mixed etchants. Etchant delivery cycles may be very rapid and under a relatively high pressure. Etchant mixes may therefore be made homogenous through shear mixing within tube 106 leading into heat exchanger 119. Each fresh delivery of etchant during a decapsulation run agitates etchant already in contact with the etch cavity on the device being processed. Some portion of etchant in contact with the package may be displaced into the waste or passages 122 in etch head 115. Passageways 122 extend from the etch cavity at the top of etch head 115 through the etch head, through heat exchanger 119, through thermoelectric cooling device 120, and through a waste junction block 128.

Pump 101 may be a diaphragm dispensing pump capable of delivering high velocity pulses of etchant to the etchant heat exchanger. Pump 101 has capability of pumping etchant from multiple sources on a cycle-by-cycle basis allowing for generation of various mix ratios of the etchants. The process in one embodiment uses fuming nitric acid, fuming or concentrated sulfuric acid, or a mixture of the two acids at a controlled temperature from the boiling point of the etchant or mixture down to below ambient temperatures.

High velocity of the pulses produces shear mixing in the etchant heat exchanger and creates turbulence in the etch cavity formed on the package exterior surface by reaction of the etchant solution with the resinous material. This turbulence provides for removal of non-reactive elements of the encapsulating resin from the etch face resulting in exposure of more of the reactive material for faster etching. The pump is also capable of withdrawing etchant from the etch cavity to again deliver the etchant with high velocity pulses. This partial recycling of the etchant reduces etchant usage while maintaining delivery of high velocity pulses at a high rate.

Waste passages 122 may be combined in waste junction block 128 into one stream transported through a waste tube 127. Combined waste then travels through tube 127 and into a second heat exchanger 102 that returns the temperature of the heated waste back to near ambient temperature. O-ring seals provide connection sealing for the waste tubes 122 at the appropriate junctions with different components. Output from second heat exchanger 102 may lead to a waste container (not illustrated) adapted to store waste etchant materials.

In one embodiment, etch plate 114 is manufactured of carbon filled-PTFE and is attached to a top plate (see FIG. 2) by screws threaded into inserts (not illustrated) installed in etch plate 114. The central area of the top plate may be relieved by machining to an extent so that heat exchanger 119 and thermoelectric device 120 may be directly affixed to etch head 115. In a preferred embodiment, Etch head 115, heat exchanger 119, and thermoelectric assembly 120 may be assembled onto etch plate 114 and placed on the top plate as a single assembly.

Etch plate 119 in one embodiment is made of carbon-filled PTFE making it stronger and more dimensionally stable than virgin PTFE. The etch plate is supported over most of its area and a separate reinforcing plate (top plate) is mounted to the bottom side to limit deformation. In addition the carbon-filled PTFE is conductive, eliminating static voltage generation. The clamping mechanism may be manufactured of conductive poly ether ether ketone (PEEK) eliminating discharges from the component to the clamping device, and may be connected to earth ground by contact with the ram return spring, the stainless steel ram mount, and through the cable earth connection to the cover mount.

In one embodiment a support plate 117 is provided to minimize tendency for the etch plate to become warped or otherwise compromised due to high pressure in etch chamber 130 and the down force of ram nose 132 on device package 116. Support plate 117 may be fixed or otherwise attached between heat exchanger 119 and etch plate 114. Support plate 117 may be mounted to the etch plate 114 by screws threaded into inserts installed in the etch plate. In one embodiment PTFE spacers may be placed between heat exchanger 119 and support plate 117. The larger area of cover mount plate 109 fairly distributes the downward force over a large area of cover 108 reducing deflection of the cover.

It is noted herein that heat exchanger 119 may incorporate a serpentine of etchant-resistant tubing that is encased in an aluminum block. This aluminum block may also contain electric heaters and has contact with thermoelectric modules that can either heat or cool the aluminum block. An electronic control mechanism operates the heaters and thermoelectric modules to maintain a constant temperature of the aluminum block. The temperature can be controlled from well below ambient temperature that is, less than 15 degrees C., to well above the boiling point of the etchant, that is, more than 250 degrees C.

Figure 2:
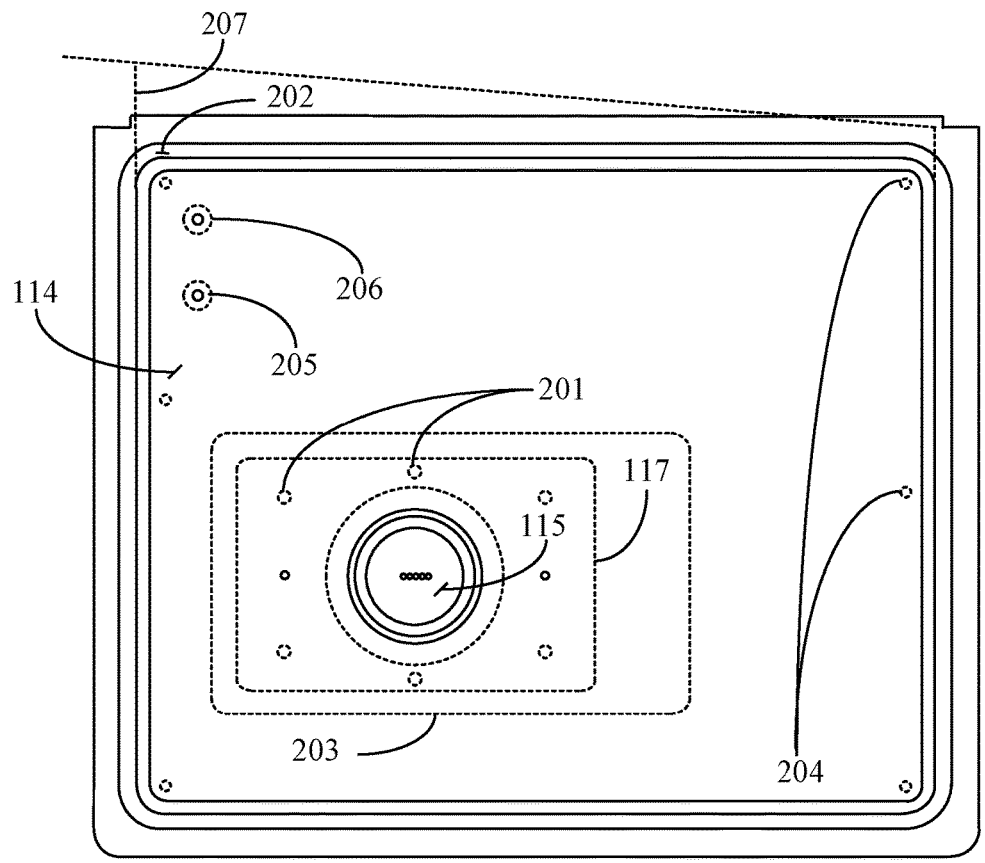
FIG. 2 is an overhead view of the etch plate of FIG. 1 and supporting hardware.

FIG. 2 is an overhead view of the etch plate assembly of FIG. 1 and supporting hardware. In this example support plate 117 is bolted to etch plate 114. Etch plate 114 includes a passageway 203 within the etch plate leaving a portion unsupported. Support plate 117 provides added support for this portion. In this example a top plate 207 may also be provided to strengthen etching plate 114. Etch head 115 is positioned offset from center on support plate 117. Threaded inserts 204 are provided to enable attachment of etch plate 114 to top plate 207. Threaded inserts 201 are provided to enable support plate 117 and heat exchanger (119 FIG. 1) to be attached to etch plate 114.

A peripheral groove 202 is provided in etch plate 114 and is adapted to seat a seal gasket, such as gasket 107 of FIG. 1, providing a seal for cover 108. Etch plate 114 includes a threaded opening 205 and a threaded opening 206. These openings facilitate attachment of tubes like tube 134 and tube 121. In this example, the offset from center location of etch head 115 facilitates PCB-mounted devices up to six inches square with a smaller cover plate. Prior art systems are centrally oriented with respect to the etch head position requiring a much larger etch plate and safety cover of up to twelve inches square to accommodate devices of the same size (6 inches). The smaller footprint of the etching system in embodiments of the invention helps to reduce possible deformation and damage to the plate and cover under high pressure in the etch chamber.

Figure 3:
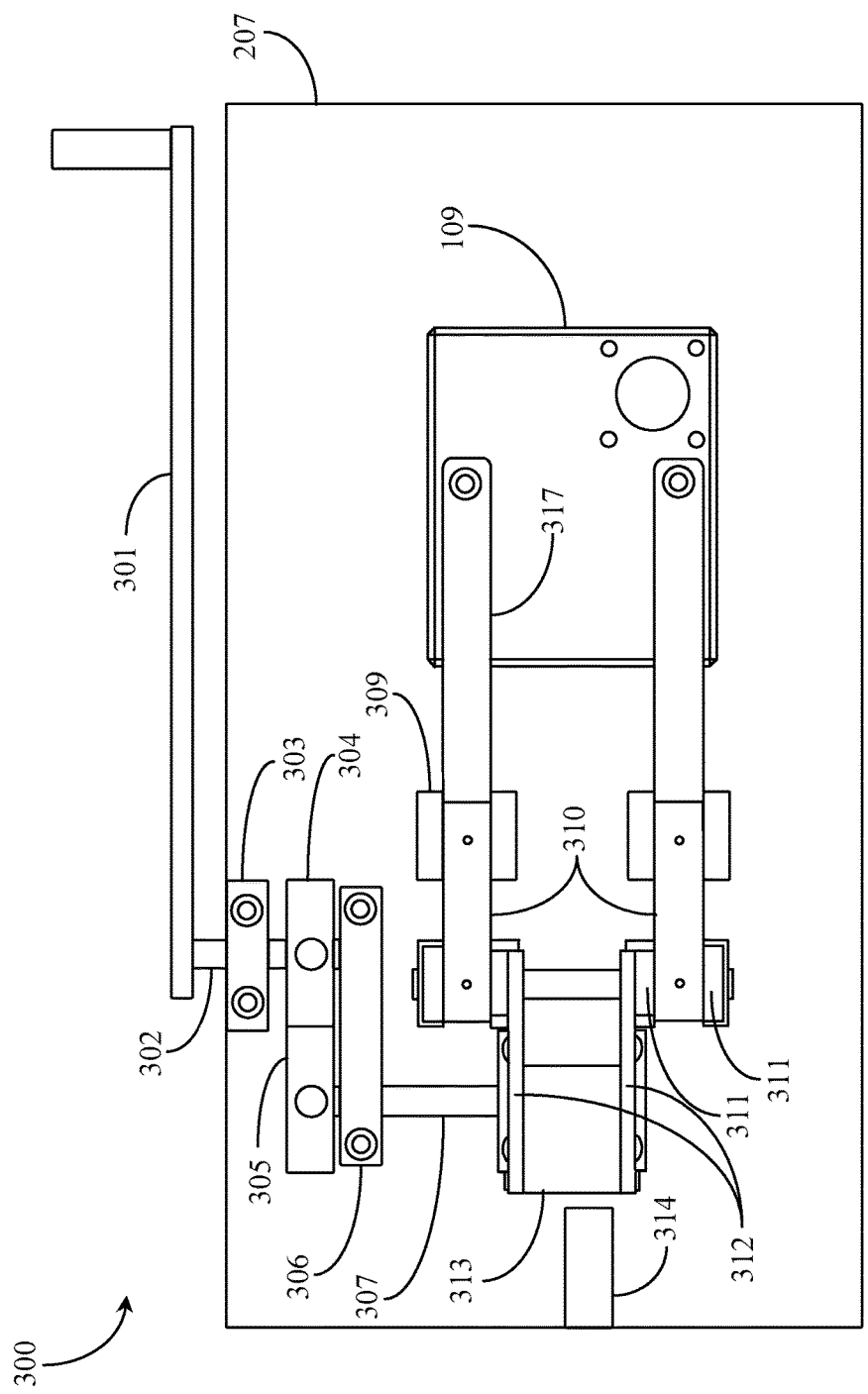
FIG. 3 is an overhead view of the decapsulator cover lifting and clamping assembly.

FIG. 3 is an overhead view of lifting and clamping assembly 300. Assembly 300 includes a lever or lift arm 301. Lift arm 301 may be manually operated to open and remove cover (108) or to clamp cover (108) to etch plate 114. Lift arm 301 is fixed to a geared shaft or axle 302. Axle 302 is housed within a bearing block 303 and a bearing block 306. Axle 302 has a fixed gear 304. Gear 304 is meshed with an adjacent fitted gear 305. Gear 305 is fixed to a second shaft or axle 307. Axle 307 is housed within bearing block 306.

Operation of lever arm 301 causes rotation of shaft 302 and concurrent gear interaction between meshed gears 304 and 305 to produce rotation of shaft or axle 307 in the opposite direction of the first rotation direction of shaft 302. Assembly 300 includes a lever 313 that is affixed in this example to shaft or axle 307. Mechanism 300 includes rotatable links 312 adapted to transmit the motion of lever 301 to two toggles (open, lock) made up of two links (not visible in this view) described further below. Mechanism 300 includes parallel cover arms 310 that are fixed to cover mount 316, which may be analogous to mounting plate 109 of FIG. 1. Cover arms 310 are thinner at arm extensions 310, which are mounted to cover mount.

Lifting and clamping assembly 300 further includes support blocks 309. Support blocks 309 are each adapted to support one cover arm 310 via a freely rotatable shaft or pin inserted through the cover arm and the support block. The cover arms may be freely rotatable at the inserted shaft or pin (not illustrated). The free ends of cover arms 310 are connected to the top of a cover mount 316 analogous to cover mount 109 of FIG. 1.

In operation when lever arm 301 is moved, its motion may be transferred through meshed gears 304 and 305, to lever 313. Lever 313 acts through links 312 and 315 (toggles) to move pivotally-mounted cover arms 310. It is noted herein that in this example all of the mechanism support architecture, such as cover arm supports 309 for example, are fixed to top plate 308. The toggle operation runs in parallel with the toggles (links 311 and 315) locking to close the cover over the etch plate or unlocking to raise the cover up and away from the etch plate. Plate 308 includes a fixed travel stop 314 that may prevent excess range of motion for lever 313.

In one example lifting upward on lever or lift arm 301 may cause the cover mount to rise, raising the cover up and off of the etch plate typically after a process is complete and a purging operation has been performed. Cover arms 310 supply the downward force required to hold safety cover (108) in place against the etch plate or top plate. The large footprint of the cover mount compared to the cover results in distribution of force over a large area of the safety cover (108) reducing any deflection occurring during clamp down (locked) toggle state.

Figure 4:
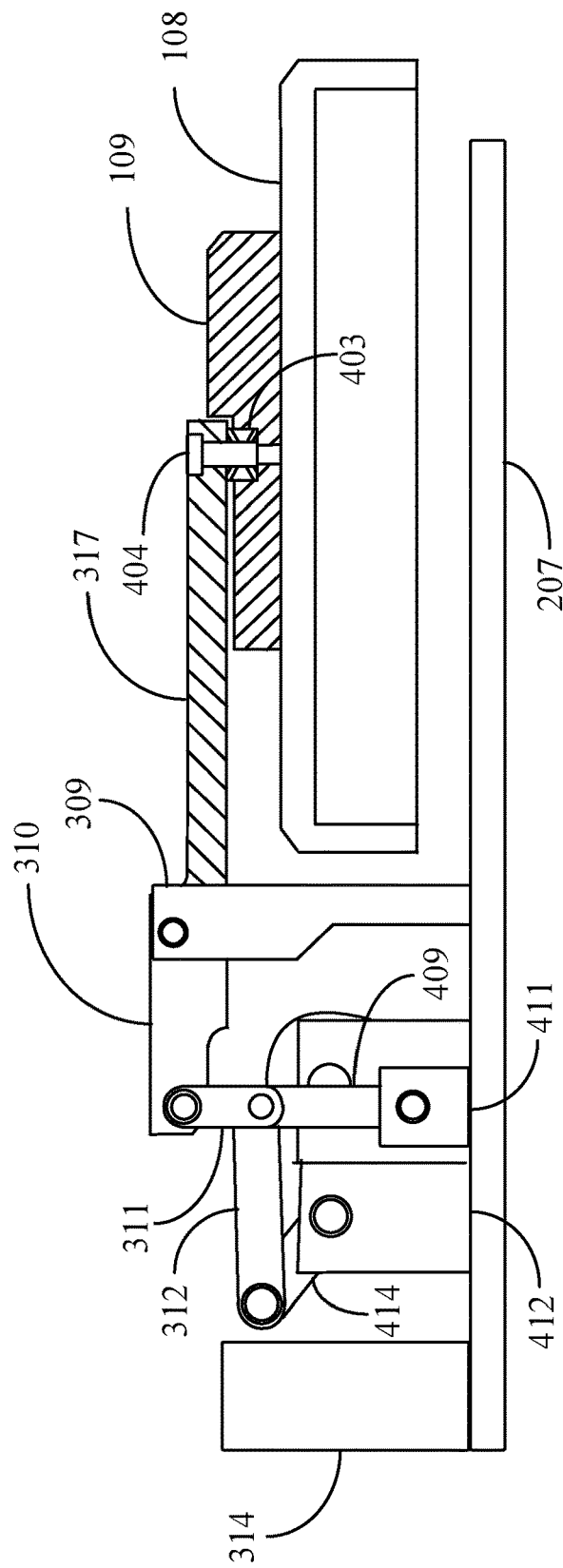
FIG. 4 is an elevation view of the cover lifting assembly of FIG. 3.

FIG. 4 is an elevation view of the cover lifting assembly of FIG. 3. Some of the components depicted in FIG. 3 are not visible in this view. As described previously, all hardware may be supported by top plate 207. A travel stop 314 is provided in one embodiment and mounted to top plate 207. Travel stop 314 limits the pivotal motion range of the pivoting safety cover (108).

Top plate 207 shows a support block 412 that hosts a pair of links (414) and (312) that are pivotally connected and are used to drive a toggle pair of links 311 and 409. One end of link 414 is be mounted to the rear side of support plate 412. Link 312 may be an intermediary link connected at one end to lever link 414. Link 414 has a fixed connection to a shaft (307) operated by a lift arm like lift arm 301. The motion of the lift arm causes the shaft to move, resulting in movement of link 414. Link 414 has a rotatable connection to intermediary link 312. Link 312 has a rotatable connection to a pair of (toggle) links including a link 312 and a link 409. Toggle links 311 and 409 form a toggle at certain positions, toggle referring herein to a switch like state for the chamber cover 108.

In this example, toggle links 311 and 409 are vertically aligned, signifying that cover 108 is down and locked. The other of two toggle states are "unlocked" or "unclamped". Links 409 and 311 are rotatably connected together. Link 411 is rotatably connected to a toggle support block 411 on the end opposite of link 311. Link 311 has a rotatable connection to cover arm 310. Cover arm 310 has a thinner extension 317 (cross hatched). The end of cover arm extension 317 may be fixed to cover mount 109 via a tension screw 404 and a "Bellville" disc spring 403.

In this clamped position safety cover 108 is forced into contact with etch plate (114, FIG. 1) compressing seal 107 (FIG. 1) resulting in a substantially gas tight seal between the cover and etch plate. In one implementation a minimum pressure for the etch chamber may be approximately 2 pound per square inch (2 PSI). When the etch chamber 34 (FIG. 1) is pressurized with minimally 2 PSI, the upward force on the safety cover is nominally 150 lb (68 Kg). At the minimum of 2 PSI, the nominal upward force on safety cover 108 is about 150 pounds. In addition, downward force of the ram body (110, FIG. 1) pushes the ram nose (132, FIG.

1) into contact with the semiconductor device to be decapsulated. This downward force results in an equal and opposite upward force on exerted on safety cover 108. The total nominal upward force on the cover is about 162 lbs. in this circumstance.

The downward force translated to cover mount 109 by cover arms 310 is greater than the upward combined force of 162 pounds. The downward closing force transmitted by the two cover arms is nominally 180 pounds, which is greater than the upward force on the safety cover plus the down force required to establish a seal between etch plate 114 and safety cover 108. As described further above the toggle links 311 and 409 are used to clamp the cover down and force up the rear end of the cover arms in parallel.

Cover arms 310 are pivotally mounted on cover arm support block 309. The applied force results in some deflection of the cover arms 310 along the thinner extensions 317. In addition there are in one embodiment several Bellville disc springs 403 located at the mounting site of each of the arms with the cover mounting plate. A shoulder screw 404 may be provided to loosely mount cover 108 via cover mount 109 to the cover arms (310). In this way safety cover 108 may freely move or deflect while downward pressure is applied. Such movement helps to get better sealing results against the etch plate.

Figure 5:
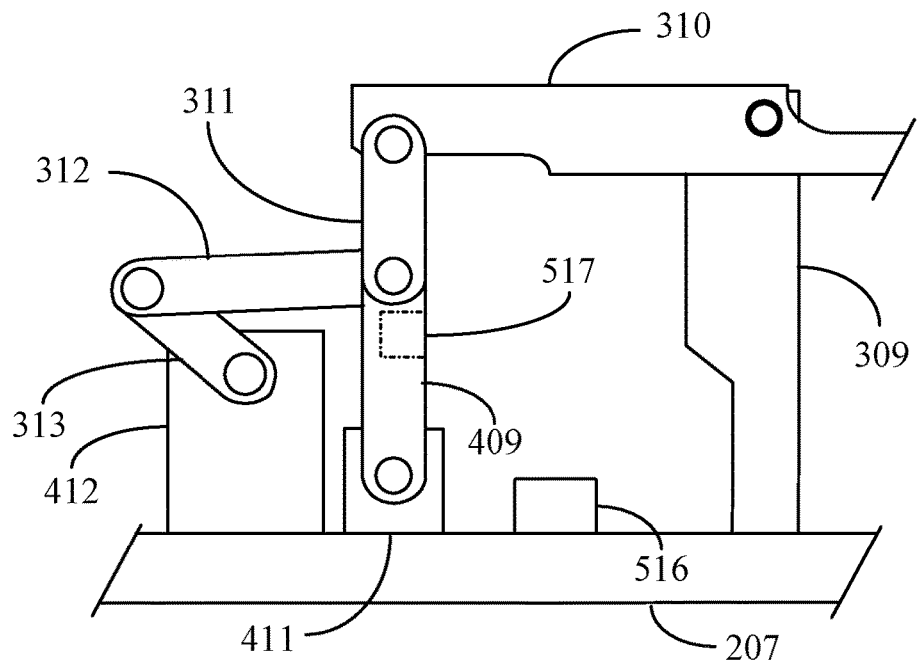
FIG. 5 is an elevation view of the linkage structure of the lifting assembly of FIG. 3 in clamped and locked position.
Figure 6:
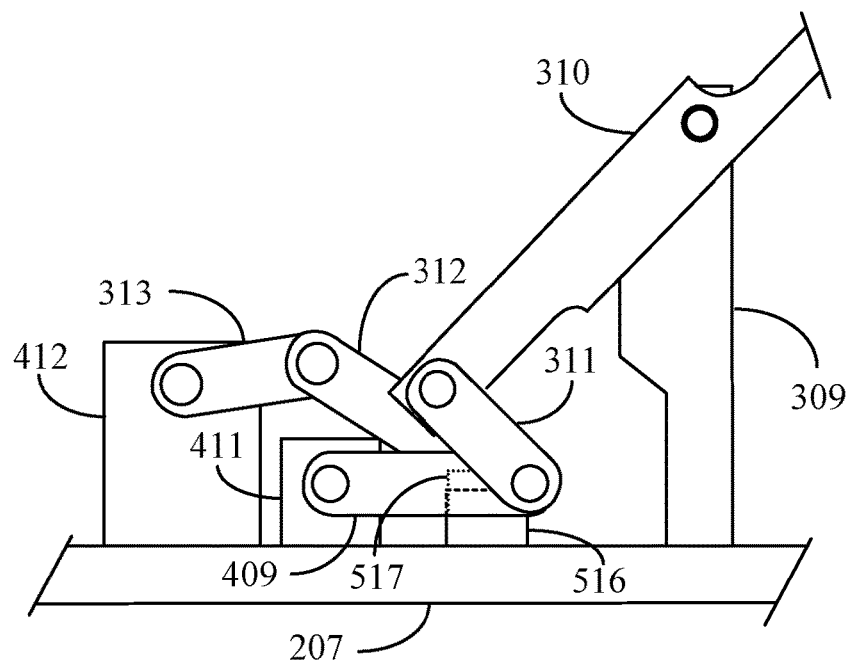
FIG. 6 is a plan view of the linkage of FIG. 5 in an unclasped or unlocked position.

FIG. 5 is an elevation view of the linkage structure of the lifting assembly of FIG. 3 in clamped and locked position. FIG. 6 is an elevation view of the linkage of FIG. 5 in an unclamped position.

Referring now to FIG. 5, toggle links 311 and 409 are vertically aligned as described for a clamped or locked position where the safety cover is closed over the etch plate. Link 313 functions as a lever being fixed at one end to a shaft extending through support block 412. Rotation of the shaft in a counter clockwise direction as viewed from this perspective forces intermediate link 312 to pull at the junction point shared with toggle links 311 and 409 resulting in a forced alignment of the toggle links vertically.

It is noted herein that each toggle link is manufactured to be over a specific dimension from center line to center line of the toggle openings or the functional length dimension of each link. In this way the links lock, putting downward pressure on the safety cover through the cover arm extensions. In one implementation a magnet 516 is provided and disposed at a strategic location on top plate 207. A second magnet 517 may be provided at a strategic location on toggle link 409. When the link apparatus is in the locked or clamped position as depicted in this example, the magnets 516 and 517 are held separate from one another. The pivot point for cover arm 310 is at attachment block 309 where the pivot pin is mounted through the cover arm.

Referring now to FIG. 6, toggle links 311 and 409 have been urged out of a vertically-aligned position associated with a closed and sealed safety cover. Reverse direction of motion applied to a lift arm (301, FIG. 3) functions to break the link alignment by pushing toggle links 311 and 409 with lever-driven intermediate link 312. The result is lifting of the safety cover via pivoting of cover arm 310 about the pivot point.

When the mechanism is brought to the full cover-open position, magnet 517 on toggle link 409 makes contact with magnet 516 mounted on top plate 207. The magnetic attraction between the magnets keeps the safety cover in the full open (pivoted) position. Referring now to FIG. 3, travel stop 314 includes an adjustable contact mechanism that may make physical contact with lever (fixed shaft link) 313 when the mechanism is in the locked down position of FIG. 5.

Referring again to FIG. 3, the amount of force exerted on lift arm 301 to close and seal the safety cover over the etch plate (114, FIG. 1) may vary considerably depending upon the position of the lift arm along the rotational path. The amount of force required to move the lift arm increases proportionally with the position of the arm along the rotational path such that the maximum required force on the lift arm occurs when the toggle links (311, and 409), lever 313 and intermediate link 312 are at full extension. The manufactured lengths of the links and lever function to set the desired force ratio.

In this example, a maximum extension force of 9 pounds is required to produce the approximate 180 pound downward force one the cover mount and cover through the extensions of the cover arms. By controlling the dimensional tolerances of the links with respect to functional length (center line to center line of link openings and the link connecting hardware (openings and pins), the desired force downward force for the locking mechanism may be configured.

Figure 7:
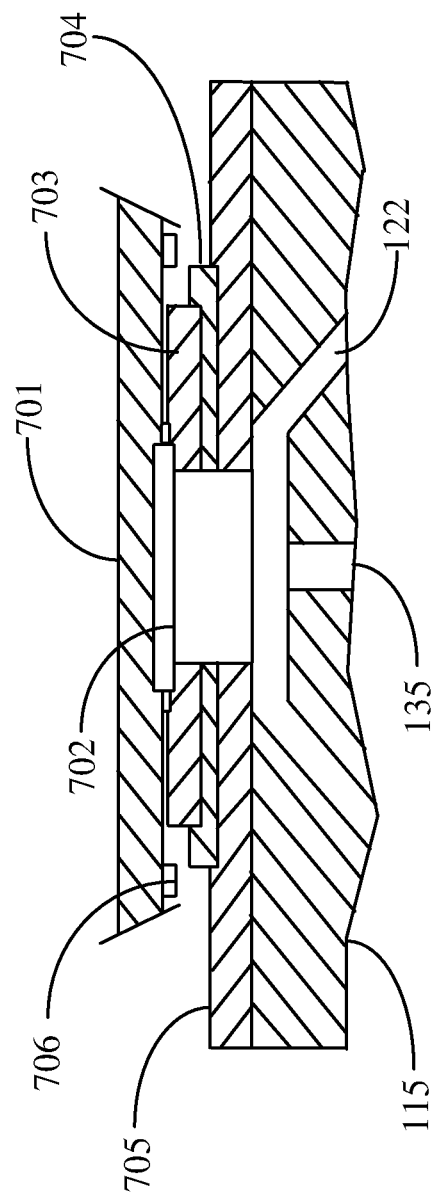
FIG. 7 is a plan view of a PCB or substrate containing a mounted semiconductor device mounted for decapsulation on the device of FIG. 1 in a multiple gasket configuration according to an embodiment of the present invention.

FIG. 7 is a sectioned elevation view of a PCB or substrate hosting a mounted semiconductor device for decapsulation on the apparatus of FIG. 1 in a multiple gasket configuration according to an embodiment of the present invention. In this example a PCB 701 has a semiconductor device 702 mounted thereon. PCB 701 also includes at least one other component 706 mounted thereon. The additional component or components mounted to the PCB require that the PCB not be positioned too close to the etch head so as not to disturb that component or components.

Semiconductor device 702 may be soldered to PCB 701 along with other components such as component 706. In this example the presence of the additional components requires that the device be a certain larger distance from etch head 115. To create a larger distance between etch head 115 and device 702, gasket stacking is employed in one embodiment. In this embodiment there are three gaskets. A gasket 705 is positioned on etch head 115. A second gasket 704 is positioned over gasket 705.

A physical feature or depression on gasket 705 enables gasket 704 to be centered over and fitted onto gasket 705. A third and top gasket 703 fits into a physical feature on the top surface of gasket 704. The physical features on the gasket surfaces may be molded pockets designed and of a size to fit another specific gasket. On the top surface of gasket 703, a physical feature or pocket is provided to accept device 702.

In one implementation the stack of gaskets may include several gaskets stacked on top of one another. With for example 8 gaskets of typical thickness, the added distance between the etch head and device may be four tenths of an inch or so (approximately 10 mm). In an implementation using multiple stacked gaskets, each of the gaskets used in the application require a central opening the size of the decapsulation window or area on the device to prevent any part of a gasket obstructing the flow of etchant during the decapsulation process.

It will be apparent to one with skill in the art that the decapsulation apparatus of the invention may be provided using some or all of the mentioned features and components without departing from the spirit and scope of the present invention. It will also be apparent to the skilled artisan that the embodiments described above are specific examples of a single broader invention that may have greater scope than any of the singular descriptions taught. There may be many alterations made in the descriptions without departing from the spirit and scope of the present invention.

It will be apparent to the skilled person that the arrangement of elements and functionality for the invention is described in different embodiments in which each is exemplary of an implementation of the invention. These exemplary descriptions do not preclude other implementations and use cases not described in detail. The elements and functions may vary, as there are a variety of ways the hardware may be implemented and in which the software may be provided within the scope of the invention. The invention is limited only by the breadth of the claims below.

The invention claimed is:

1. A method for decapsulating comprising the steps:
placing an encapsulated device or a printed circuit board including an encapsulated device on a gasket on an etch head supported substantially off-center on an etch plate, the etch head and gasket having an opening exposing the encapsulated device to a reaction region below the etch head;
sealing a vertically-translatable cover to the etch plate with a toggle mechanism mounted to a metal plate to which the etch plate is mounted, the etch plate and cover forming an etching chamber over the etch head;
urging the encapsulated device against the gasket by a ram mechanism operating sealed through the cover;
continuously purging the etching chamber with a pressure-controlled source of Nitrogen or inert gas;
delivering an etchant solution to the reaction region from a controlled pump drawing etchant solution in a preset ratio from one or more sources;
heating or cooling the etchant solution in passages leading to the reaction region through a heat exchanger;
removing used etchant solution from the reaction region through one or more waste passages.

2. The method of claim 1 wherein a portion of the etchant is oscillated out of and back into the reaction region, digesting resinous material on the encapsulated device to form a hole in the resinous material.

3. The method of claim 1 wherein the temperature of the etchant mix is controlled to be in a range of from 0 degrees Celsius to 250 degrees Celsius.

4. The method of claim 1 wherein multiple interlocking gaskets are used to seal the PCB or encapsulated device to the etch head.

5. The method of claim 1 wherein the controlled pump draws etchant solution from two separate sources, one providing fuming sulphuric and the other fuming nitric acid, shear mixes the solution in the passages through the heat exchanger, and oscillates a portion of the mixture into and back out of and back into the reaction region.

6. The method of claim 5 wherein the ratio of nitric to sulphuric acid in the etchant solution is controlled, and the heat exchanger is controlled to maintain the temperature of the etchant solution above the known freezing temperature of the etchant solution at the ratio selected and controlled.

7. The method of claim 5 wherein the ratio of nitric to sulphuric acid in the etchant solution is controlled, and the heat exchanger is controlled to maintain the temperature of the etchant solution below the known boiling temperature of the etchant solution at the ratio selected and controlled.

8. The method of claim 6 wherein the ratio of nitric to sulphuric acid is controlled to be 0:1, 1:1, 2:1, 3:2, 3:1, 7:2, 4:1, 5:1, 6:1, 9:1, or 1:0.

9. The method of claim 1 wherein multiple interlocking gaskets are used to seal the encapsulated device or PCB to the etch head, wherein each gasket has a rectangular recess that precisely fits the next higher gasket, each gasket is larger than the next higher gasket, and the top gasket has a recess that closely fits the encapsulated device or PCB.

* * * * *